(12) United States Patent
Singleton et al.

(10) Patent No.: US 9,659,585 B2
(45) Date of Patent: May 23, 2017

(54) MAGNETIC SENSOR SEED LAYER WITH MAGNETIC AND NONMAGNETIC LAYERS

(75) Inventors: Eric Walter Singleton, Maple Plain, MN (US); Antonia Tsoukatos, Maple Grove, MN (US); Liwen Tan, Minneapolis, MN (US); Jae-Young Yi, Shakopee, MN (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 477 days.

(21) Appl. No.: 13/993,166

(22) PCT Filed: Dec. 15, 2011

(86) PCT No.: PCT/US2011/065102
§ 371 (c)(1),
(2), (4) Date: Jul. 29, 2013

(87) PCT Pub. No.: WO2012/082998
PCT Pub. Date: Jun. 21, 2012

(65) Prior Publication Data
US 2013/0293225 A1 Nov. 7, 2013

Related U.S. Application Data

(60) Provisional application No. 61/423,441, filed on Dec. 15, 2010.

(51) Int. Cl.
*G01R 33/02* (2006.01)
*G11B 5/39* (2006.01)
(Continued)

(52) U.S. Cl.
CPC ............... *G11B 5/39* (2013.01); *B82Y 25/00* (2013.01); *B82Y 40/00* (2013.01); *G01R 33/093* (2013.01);
(Continued)

(58) Field of Classification Search
CPC .. B82Y 25/00; G01R 33/093; G01R 33/0206; G01R 33/028; G01R 33/038;
(Continued)

(56) References Cited

U.S. PATENT DOCUMENTS 6,278,592 B1 8/2001 Xue et al.
6,317,299 B1 * 11/2001 Pinarbasi ............... B82Y 10/00
360/324.1
(Continued)

OTHER PUBLICATIONS

Dictionary.com. http://dictionary.reference.com/browse/adjacent, 2015.*
(Continued)

*Primary Examiner* — Patrick Assouad
*Assistant Examiner* — Demetrius Pretlow
(74) *Attorney, Agent, or Firm* — Hollingsworth Davis, LLC

(57) ABSTRACT

A magnetic sensor has a bottom shield layer, an upper shield layer, and a sensor stack adjacent the upper shield layer. The sensor includes a seed layer between the bottom shield layer and an antiferromagnetic layer of the sensor stack. The seed layer has a magnetic layer adjacent the sensor stack and a nonmagnetic layer adjacent the bottom shield layer.

15 Claims, 10 Drawing Sheets

(51) Int. Cl.
    *B82Y 25/00* (2011.01)
    *G01R 33/09* (2006.01)
    *H01F 10/30* (2006.01)
    *H01L 43/08* (2006.01)
    *H01L 43/10* (2006.01)
    *H01F 41/30* (2006.01)
    *B82Y 40/00* (2011.01)
    *H01F 10/32* (2006.01)

(52) U.S. Cl.
    CPC .......... *G11B 5/3906* (2013.01); *G11B 5/3912* (2013.01); *H01F 10/30* (2013.01); *H01F 41/307* (2013.01); *H01L 43/08* (2013.01); *H01L 43/10* (2013.01); *H01F 10/3272* (2013.01)

(58) Field of Classification Search
    CPC .. G01R 33/1215; G01R 33/12; G11B 5/3906; G11B 5/3912; G11B 5/39; G11B 5/008; H01F 10/30; H01F 1/0308; H01L 43/08; B64G 1/366; H04N 21/42661; G11C 11/061; G05B 2219/36117; G10H 1/005; Y10T 29/4902; Y10T 29/53165; G06F 3/0676
    USPC .......... 324/252, 210–212, 207.21; 338/32 R; 360/324–328
    See application file for complete search history.

(56) References Cited

U.S. PATENT DOCUMENTS

| | | | | |
|---|---|---|---|---|
| 6,556,390 B1 * | 4/2003 | Mao | ...................... | B82Y 10/00 360/324.1 |
| 6,713,800 B2 | 3/2004 | Chen et al. | | |
| 6,791,806 B1 | 9/2004 | Gao et al. | | |
| 7,248,449 B1 | 7/2007 | Seagle | | |
| 7,476,954 B2 | 1/2009 | Wang et al. | | |
| 8,341,826 B1 * | 1/2013 | Jiang | .................... | G11B 5/3169 216/22 |
| 2003/0184918 A1 * | 10/2003 | Lin | ........................ | B82Y 10/00 360/314 |
| 2003/0206381 A1 | 11/2003 | Hou et al. | | |
| 2005/0068692 A1 | 3/2005 | Freitag | | |
| 2005/0161752 A1 | 7/2005 | Seigler | | |
| 2006/0007605 A1 * | 1/2006 | Li | .......................... | B82Y 10/00 360/324.1 |
| 2006/0012924 A1 * | 1/2006 | Takano | .................... | G11B 5/39 360/324.1 |
| 2007/0014054 A1 * | 1/2007 | Zhang | ................... | B82Y 40/00 360/324.12 |
| 2007/0064352 A1 * | 3/2007 | Gill | ....................... | B82Y 25/00 360/324.11 |
| 2007/0127166 A1 | 6/2007 | Kamai et al. | | |
| 2008/0158741 A1 | 7/2008 | Lin | | |
| 2008/0171223 A1 | 7/2008 | Wang et al. | | |
| 2008/0225585 A1 | 9/2008 | Ranjan et al. | | |
| 2009/0174968 A1 | 7/2009 | Singleton et al. | | |
| 2009/0251829 A1 | 10/2009 | Zhang et al. | | |
| 2009/0296278 A1 * | 12/2009 | Inamura | ................ | B82Y 10/00 360/135 |
| 2010/0002336 A1 | 1/2010 | Sun et al. | | |
| 2010/0149696 A1 * | 6/2010 | Chen | ....................... | G11B 5/40 360/313 |
| 2010/0309580 A1 * | 12/2010 | Tonooka | ................ | G11B 5/667 360/75 |
| 2011/0249365 A1 * | 10/2011 | Zeltser | ................... | G11B 5/147 360/244 |

OTHER PUBLICATIONS http://www.thefreedictionary.com/adjacent, adjacent definition, 2016.*

Mar. 13, 2012, International Search Report and Written Opinion dated Mar. 13, 2012 from PCT Application No. PCT/US2011/065102, 14 pages.

* cited by examiner

Scaled Estimates

Nominal factors expanded to all levels
Continuous factors centered by mean, scaled by range/2

| Term | Scaled Estimate | | Std Error | t Ratio | Prob>|t| |
|---|---|---|---|---|---|
| Intercept | 33.270150 | | 0.04071 | 817.25 | 0.0000* |
| HE_MTP_10 | 0.0839244 | | 0.119788 | 0.71 | <.0001* |
| (HE_MTP_10-2.6220)*(HE_MTP_10-2.6220) | 1.3264234 | | 0.348504 | 3.81 | 0.0001* |
| HE_CHIRP | -2.455882 | | 0.072975 | -33.65 | <.0001* |
| (HE_CHIRP-7.43842)*(HE_CHIRP-7.43842) | 0.9025180 | | 0.104343 | 8.65 | <.0001* |
| HE_MOD | 1.2899231 | | 0.144902 | 8.90 | <.0001* |
| (HE_MOD-5.02533)*(HE_MOD-5.02533) | -1.068883 | | 0.161509 | -6.62 | <.0001* |
| Type[FL Eval] | 0.3480893 | | 0.061065 | 5.70 | <.0001* |
| Type[NiFe_20] | 0.6602361 | | 0.07609 | 8.61 | <.0001* |
| Type[NiFe_200] | -1.069359 | | 0.07405 | -14.44 | <.0001* |
| Type[NiFe_80] | -0.599802 | | 0.082781 | -7.25 | <.0001* |
| Type[NS36 BL] | 1.0317866 | | 0.044295 | 23.29 | <.0001* |
| Type[TaNiFe_ML_20] | 0.0468598 | | 0.079188 | 0.17 | <.0001* |
| Type[TaNiFe_ML_40] | -1.017954 | | 0.074652 | -13.64 | <.0001* |
| HE_TESTER_I0V3C-J253A | -0.337217 | | 0.045295 | -7.45 | <.0001* |
| HE_TESTER_I0V3C-J914A | 0.5308378 | | 0.035944 | 14.77 | <.0001* |
| HE_TESTER_I0V3C-J915A | -0.193621 | | 0.031198 | -6.21 | <.0001* |

FIG. 5

MAGNETIC SENSOR SEED LAYER WITH MAGNETIC AND NONMAGNETIC LAYERS

BACKGROUND

In an electronic data storage and retrieval system, a magnetic recording head may include a reader portion having a sensor for retrieving magnetically encoded information stored on a magnetic disc. Magnetic flux from the surface of the disc causes rotation of the magnetization vector of a sensing layer or layers of the sensor, which in turn causes a change in the electrical properties of the sensor. The sensing layers are often called free layers, since the magnetization vectors of the sensing layers are free to rotate in response to external magnetic flux.

The change in the electrical properties of the sensor may be detected by passing a current through the sensor and measuring a voltage across the sensor. Depending on the geometry of the device, the sense current may be passed in the plane (CIP) of the layers of the device or perpendicular to the plane (CPP) of the layers of the device. External circuitry then converts the voltage information into an appropriate format and manipulates that information as necessary to recover information encoded on the disc.

Contemporary read heads may include a thin film multilayer structure containing ferromagnetic material that exhibits some type of magnetoresistance (MR). A typical MR sensor configuration includes a multilayered structure formed of a nonmagnetic layer positioned between a synthetic antiferromagnet (SAF) and a ferromagnetic free layer, or between two ferromagnetic free layers. The resistance of the MR sensor depends on the relative orientations of the magnetization of the magnetic layers.

An MR sensor may include shields made of high permeability materials that function to protect the sensor from stray magnetic fields originating from adjacent magnetic bits on the medium. With decreasing sensor size, the shield-to-shield spacing of the MR sensor should be made smaller to adequately screen the flux from adjacent bits.

SUMMARY

One embodiment described herein is directed to a magnetic sensor having a bottom shield layer, an upper shield layer, and a sensor stack adjacent the upper shield layer. The sensor includes a seed layer between the bottom shield layer and an antiferromagnetic layer of the sensor stack. The seed layer has a magnetic layer adjacent the sensor stack and a nonmagnetic layer adjacent the bottom shield layer. These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures.

FIGS. 4B, 5, and 6 are graphs showing spin stand results for multilayer structures according to example embodiments;

DETAILED DESCRIPTION

To advance recording density, it is desirable for read sensor structures to reduce dimensions. For example, by reducing read sensor width, the sensor can read narrower written tracks. Similarly, by reducing read sensor shield-to-shield spacing, the sensor can read reduced length bits. These reduced-sized bit structures are needed to increase bit storage density in magnetic storage devices.

Figure 1A:
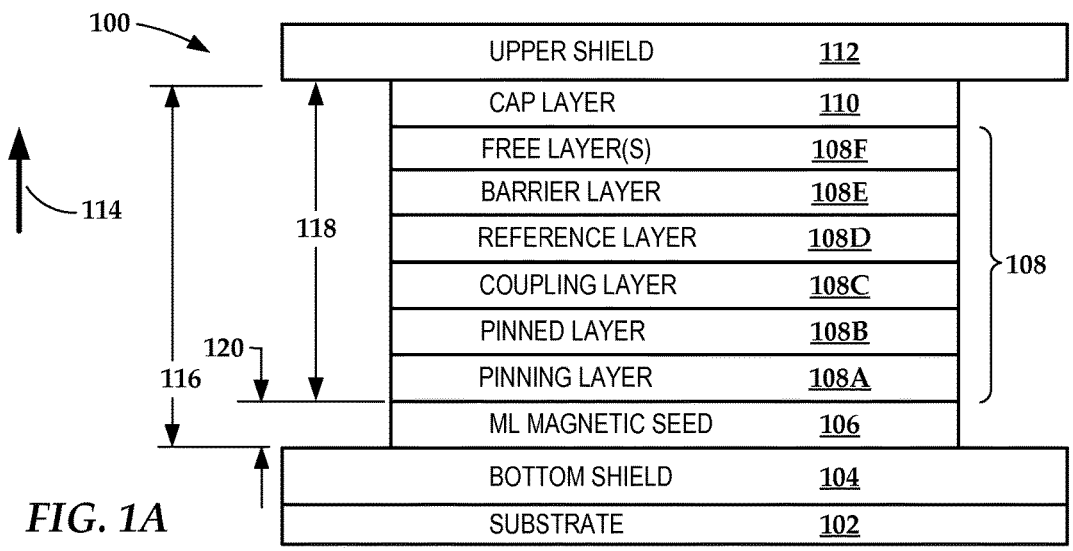
FIGS. 1A and 1B are a block diagrams of a magnetic sensor assemblies according to example embodiments.

For purposes of illustration, a block diagram in FIG. 1 shows a read sensor assembly 100 according to an example embodiment. The sensor assembly 100 includes a bottom shield layer 104 disposed on top of a substrate 102. A multi-layer seed layer 106 is disposed on top of the bottom shield 104, and serves as an interface between the bottom shield 104 and a magnetic sensor stack 108. In this example, the magnetic sensor stack 108 is shown as a tunneling magnetoresistive (TMR) sensor, although, as described in greater detail below, the embodiments need not be limited to a TMR-type sensor stack.

The magnetic sensor stack 108 includes a pinning layer 108A, pinned layer 108B, coupling layer 108C, reference layer 108D, barrier layer 108E, an one or more free layers 108F. Also shown on top of the sensor stack 108 is a cap layer 110 and upper shield 112. The shield layers 104, 112 may be made of a magnetic material, such as NiFe, NiFeCu, or NiCoFe. The sensor stack 108 may be formed by depositing successive layers on bottom shield layer 104 or may be formed in a separate process (either with or without seed layer 106) and later incorporated between the bottom and upper shield layers 104, 112.

The sensor assembly 100 may be incorporated in a slider or other structure that is positioned close to a magnetic medium (e.g., magnetic disk, not shown) disposed parallel to the drawing plane. The medium moves relative to the assembly 100 in a downtrack direction indicated by arrow 114. Changes in magnetic polarity of the medium resulting from this relative movement are sensed by layers of the sensor stack 108. The magnetization of reference layer 108D is fixed while the magnetizations of free layers 108F rotate in response to the external magnetic field from the magnetic medium. Pinned layer 108B and reference layer 108D are magnetically coupled by coupling layer 108C and make up a synthetic antiferromagnet (SAF).

The magnetization direction of pinned layer 108B, which is opposite the magnetization direction of reference layer 108D, is pinned by exchange coupling pinning layer 108A with pinned layer 108B. Seed layer 106 enhances the grain growth of pinning layer 108A and cap layer 110 adds a protective layer to the top of magnetic sensor stack 108. Bottom and upper shields 104, 112 protect magnetic sensor 38 from flux emanated from adjacent tracks on the magnetic medium.

The magnetic sensor assembly 100 produces a signal when a sense current is passed through the layers of sensor stack 108. In some embodiments, the bottom and upper shields 104, 112 deliver the sense current to sensor stack 108. The sense current experiences a resistance that is proportional to the angle between the magnetization direction of free layers 108F and the magnetization direction of reference layer 108D.

While the magnetic sensor stack 108 is shown as a TMR sensor in FIG. 1, it will be appreciated that other sensor configurations are possible. For example, magnetic sensor stack 108 may alternatively be configured to exhibit a giant magnetoresistance (GMR) or other types of magnetoresistance. In addition, pinning layer 108A, pinned layer 108B, coupling layer 108C, and reference layer 108D may alternatively be replaced by one or more free layers to provide a tri-layer type magnetic sensor.

The magnetic sensor assembly 100 has a physical shield-to-shield spacing 116. The linear density of magnetic sensor assembly 100 along the downtrack direction 114 is correlated to the shield-to-shield spacing 116. Consequently, in order to increase the linear density (e.g., the number of magnetic transitions per unit length) of magnetic sensor assembly 100, an effective shield-to-shield spacing may be reduced from physical shield-to-shield spacing 116.

Magnetic sensor stability and noise becomes an issue for sensors with narrower track widths and stripe heights of sub-50 nanometer (nm). These issues are further magnified by the reduction in the magnetic layer thickness of the constituent stack layers in efforts to improve sensor resolution (e.g., through reduced shield-to-shield spacing). Reduction in shield-to-shield spacing 116 can lead to degraded magnetic performance stability and signal-to-noise ratio (SNR). There continues to be a need for reduced shield-to-shield spacing read sensors that provide for enhanced performance and stability.

One difficulty that may be encountered when attempting to reduce read sensor shield-to-shield spacing 116 is that stack layer thicknesses may already be at or close to the superparamagnetic limit under single standing film considerations. Further reduction in read sensor shield-to-shield spacing by scaling of individual layers of the read sensor can be counterproductive because it contributes to more sensor readback noise and instability, thus nullifying the effect of shield-to-shield spacing reduction.

Utilizing a single layer magnetic seed in an attempt to reduce read sensor shield-to-shield spacing can result in increased dispersion concerns as the coercivity of the pinned layer becomes competitive to the pinning field of pinning layer 108A at the antiferromagnetic (AFM) film thicknesses under consideration for present generation read sensors.

The effective longitudinal bias at thicknesses below 100 angstroms may cause difficultly with current process capabilities, further complicating read sensor shield-to-shield spacing reduction. Domain formation at the edges of the top or bottom shields represents another difficulty, which may occur when shield materials are designed to be soft to accommodate high permeability requirements.

Paths to reduce effective read sensor shield-to-shield spacing while maintaining layer magnetic integrity are in demand. Embodiments of the disclosure are directed to achieving reduced shield-to-shield spacing read sensor by substitution of an AFM seed layer with a high moment magnetic multilayer structure 106 that contributes to a reduction in overall final effective shield-to-shield spacing distance 118. Generally, the effective shield-to-shield spacing refers to a sensing region within the sensor assembly along the downtrack direction 114 that can provide sufficient magnetic shielding from adjacent downtrack bits. The seed layer 106 has thickness 120, and this thickness may be subtracted from the physical shield-to-shield spacing 120 when determining the effective shield-to-shield spacing 118. Embodiments of the disclosure can provide for a reduction in read sensor shield-to-shield spacing in the range of 3-5 nm, which similar to thickness of nonmagnetic seed layer used in present generation read sensors.

Various embodiments provide for the introduction of a high magnetic moment soft ferromagnetic material as an interface layer to the bottom shield 104 and the AFM pinning layer 108A. Various embodiments provide for the replacement of the nonmagnetic material of an AFM seed to provide a reduced effective shield-to-shield spacing. In addition, and to provide a balanced shield structure across the read sensor (also referred to herein interchangeably as a reader), a top layer of the same structure can be introduced just below the seed of the upper shield, as shown in FIG. 1B.

Figure 1B:
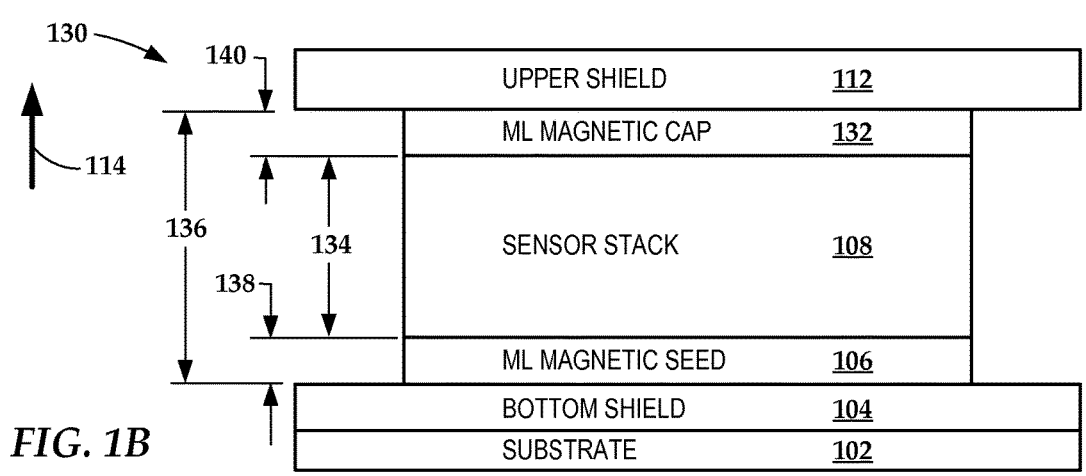

In FIG. 1B, the block diagram illustrates a magnetic sensor assembly 130 according to another embodiment. In FIG. 1B, the same reference numbers are used to indicate like components shown and described in FIG. 1A. For purposes of clarity, the sensor stack 108 is shown without its layers. In addition to the multilayer magnetic seed layer 106, this embodiment includes a multilayer magnetic cap 132, which replaces cap layer 110 shown in FIG. 1A. This top layer 132 can potentially replace the cap layer 110 (which acts as a seed for the upper shield 112) and/or may be placed in addition to a upper shield seed so as to minimize route modification requirements and achieving functionality requirements. This results in an effective shield-to-shield spacing 134 that can be determined by a physical shield-to-shield spacing 136 minus thicknesses 138, 140 of the bottom and top multilayer layers 106, 132, respectively.

Embodiments of the disclosure include use of new materials that have not been utilized in the past nor disclosed as for seed layers for read sensors. For example, various disclosed embodiments utilize a magnetic seed layer 106 includes NiW. Various other embodiments can utilize alternative magnetic seed layers 106, such as seed layers 106 that include NiFeW, NiCoW, or NiCoFeW alloys, and magnetic seed layer structures of seed/NiFeW and seed/NiFeW multilayers, such as Ta/NiFeW or Ta/NiFeW multilayers, for example. Any of these material combinations may be applicable to the multilayer cap layer 132 as well.

Figure 1C:
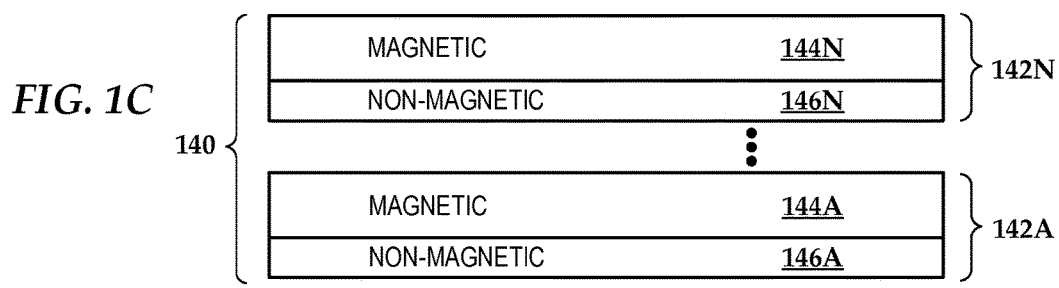
FIG. 1C is a block diagram of a multi-bilayer structure according to an example embodiment.

It has been found that use of the various magnetic seed layers and multilayer magnetic seed layers disclosed herein provide for increased resolution and reader stability. Useful multilayered structures according to various embodiments include those targeting total magnetic layer height below and potentially above the reader stack (e.g., effective spacings 118 and/or 134) in the 1.2-20 nm range. For purposes of the following discussion, description of multilayer structures will make reference to multilayer magnetic layer 140 as shown in FIG. 1C. One or both of the multilayer seed 106 in FIGS. 1A and 1B and multilayer cap 132 in FIG. 1B may include features described for structure 140.

Multilayer structure 140 includes one or more bi-layers, here represented as bi-layers 142A and 142N. Each bi-layer 142A, 142N includes respective magnetic layers 144A, 144N and nonmagnetic layers 146A, 146N. The magnetic layers 144A, 144N may each be formed from the same or different materials, and those materials may include a high magnetic moment soft ferromagnetic material. Example magnetic materials used to form the magnetic layers 114N include NiFe, NiFeW, NiCoW, or NiCoFeW, CoNiFe, CoFeB, and NiFeB.

The nonmagnetic layers 146A, 146N may be significantly thinner (e.g., half as thick or less) than the magnetic layers 144A, 146N. The individual magnetic layers 144A, 146N and nonmagnetic layers 146A, 146N may have different thicknesses.

For example, the bottom nonmagnetic layer 146A (that interfaces with a shield 104, 112 or stack 108) may be thicker than inner nonmagnetic layers such as layer 146A. The nonmagnetic layers 146A, 146N may be formed from materials such as Ta, Ru, TaCr, and NiW. The structure 140 may be formed within the structures 100, 130 so that the outer nonmagnetic layer 146A faces either the shields 104, 112 or stack 108, in which case the outer magnetic layer 144N would face the stack 108 or shields 104, 112, respectively.

In the discussions that follow, examples of structure 140 are described that are formed as seed layers (e.g., seed layer 106) arranged with the nonmagnetic layer 146A facing bottom shield 104. In these examples, layer structure is described as M1/M2, where M1 and M2 are different materials, and where M1 is deposited first in the stack production process. Because layers are built up starting with the substrate 102 as a base, an example multilayer seed layer of Ta/NiFe would have the nonmagnetic Ta layer deposited on the bottom shield 104, followed by the NiFe layer, which is then followed by the bottom layer of the stack 108 (e.g., pinning layer 108A in FIG. 1A). In such a case, if a multilayer cap layer 122 is used with (or instead of) the multilayer cap 132, the cap 132 may be configured in reverse. Namely, the multilayer cap 132 would have a bottom magnetic layer 144A on top of the sensor stack 108, followed by the bottom nonmagnetic layer 146A, followed by upper shield 112.

As will be discussed in detail below, various multilayer structures 140 were individually evaluated for film level magnetic properties in terms of coercivity and anisotropy field. Utilizing multilayer structures 140 of the type described herein provides a means to meet requirements for the seed layer of the AFM material utilized, e.g., in pinning layer 108A. By carefully choosing materials and optimizing deposition conditions, the resulting device 100 may exhibit adequate pinning field, low coercivity, and high blocking temperature. In addition, suitable multilayer structures 140 have low coercivity and adequate anisotropy to ensure the shielding effect is maintained for reduced shield-to-shield spacing. Multilayer structures 140 according to embodiments of the disclosure provide for suitable reader stability and high MR response.

It has been found that a multilayer structure 140 with a magnetic layer 144A, 144N of NiFe, CoFe, NiW or NiFeW alloy, and second thin nonmagnetic layer 146A, 146N produces desirable magnetic and structural properties compared to a single layer of NiFe or CoFe as a seed layer for the AFM material. Other high magnetic moment, magnetically soft materials such as CoNiFe, CoFeB, or NiFeB may also be suitable for the magnetic layer 144A, 144N.

Embodiments of the disclosure are generally directed to the use of magnetic seed layers in the construction of current perpendicular to the plane (CPP) readers with reduced shield-to-shield spacing. More particularly, embodiments of the disclosure are directed to utilizing a very thin layer that may be nonmagnetic or with lower magnetic moment within the magnetic seed structure and yet realize desired resolution in the reader. Using a seed layer or multilayer of seed and magnetic material in accordance with various embodiments is can result in a stable reader device with adequate pinning in the read sensor structure.

Nonmagnetic spacer layers 146A, 146N may be chosen to provide optimal crystalline growth texture when coupled with the magnetic layer 144A, 144N. In addition, the thickness of the nonmagnetic spacer 146A, 146N is minimized to ensure the multilayer seed layer is magnetostatically coupled, thus providing good soft magnetic properties. This enables the multilayer structure 140 to couple with the shields 104, 112 and thereby act as shield layer as well as provide seed for the reader structure to grow upon. Suitable spacer materials include Ta, Ru, TaCr, NiW, among others. The spacer material may include an amorphous layer or a layer that aids in promoting good crystalline texture of the multilayer seed structure.

Various process embodiments can utilize current tooling and instrumentation to deposit the new material structure sequentially during the initial part of the reader stack deposition and in place of the AFM material seed. For example, AFM seed layers may currently be formed from a nonmagnetic material such as Ta, Ru or Ta/Ru bi-layer, for example. Various processes may require a target arrangement of the sputtering tool in order to maintain a certain mode of operation in terms of resulting stack capabilities and tool layout. Such tooling configuration optimization will readily be appreciated by one skilled in deposition technology.

Various processes can be implemented that define the stack without regard to retaining the magnetic seed across the surface of the bottom shield. However, it may be desirable to modify the step to achieve balance in the shield configuration spanning the reader stack. Achieving a balanced shield configuration can be enhanced by focusing effort on balancing the moment across the stack, reducing the effective shield-to-shield spacing, and studying the effects on sensor read back pulse width at 50% amplitude level (PW50). The seed area of the upper shield can also be seeded with an additional multilayer structure of high moment magnetic material, as in the AFM seed process.

Each multilayer structure 140 is controlled for magnetic properties via low field magnetic measurement, and targeting of the thickness is controlled via constituent single films qualifications. A reduction in the pinning field is counteracted by reduced dispersion of the pinned layer as indicated by the coercivity data collected in the short loop experiments described below.

The following discussion provides examples of various embodiments in accordance with the disclosure. In general, the processes described below in accordance with various embodiments can utilize current tooling and instrumentation to deposit a new material structure sequentially during the first part of the reader stack deposition and in place of a non magnetic AFM seed layer such as Ta, Ru or Ta/Ru bi-layer.

Figure 2A:
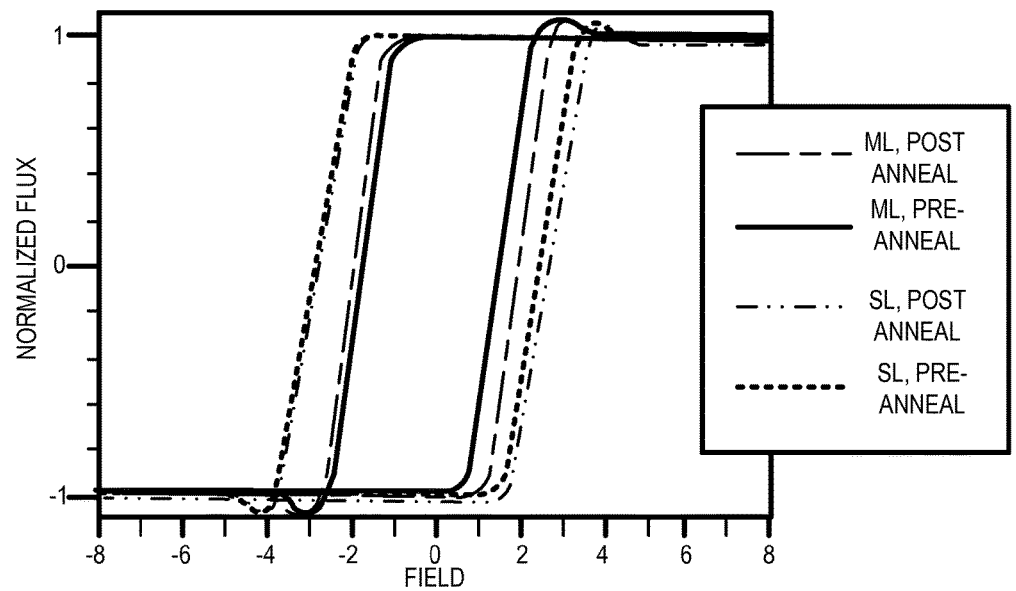
FIGS. 2A and 2B are hysteresis loops illustrating magnetic properties of a multilayer structure according to an example embodiment.
Figure 2B:
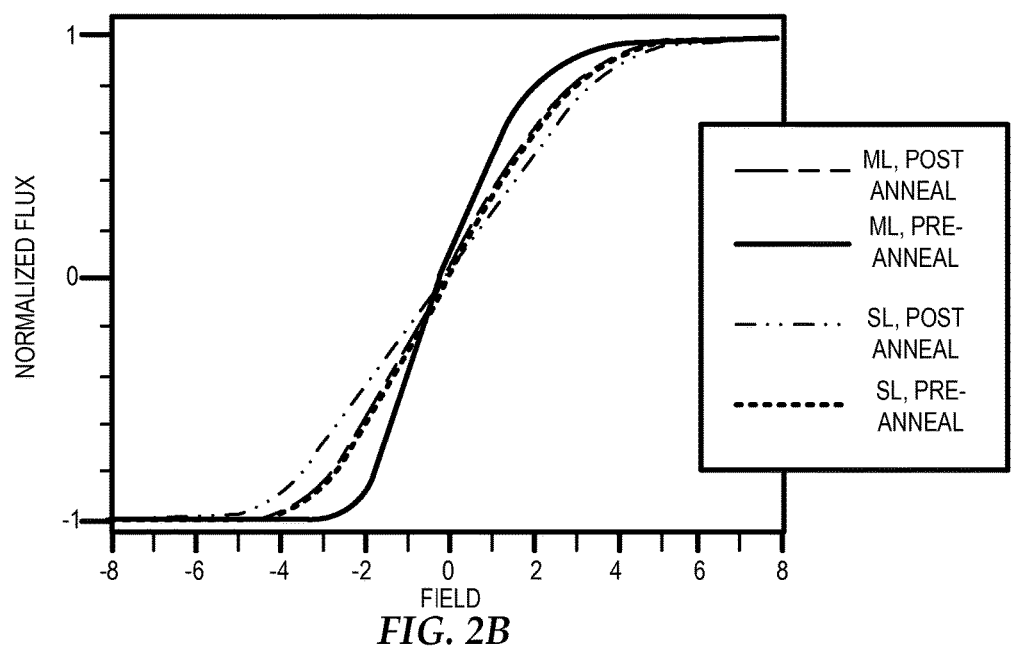

According to a first illustrative example, a multilayer seed structure 140 of Ta_x(NiFe_y/Ta_z)n)NiFe_x is deposited, where x, y, and z denote the thickness of each layer in nanometers and n is the number of layer repeats. FIGS. 2A and 2B show multilayer seed vs. single layer seed magnetic properties of Hce, Hk, etc. FIGS. 2A and 2B show a multilayer (ML) seed of (Ta/NiFe)x3 vs. a single layer seed (Ta/NiFe) easy axis hysteresis loop (FIG. 2A) and hard axis hysteresis loop (FIG. 2B). It can be seen that the multilayer seed results in reduce seed coercivity and equivalent anisotropy field.

Figure 3A:
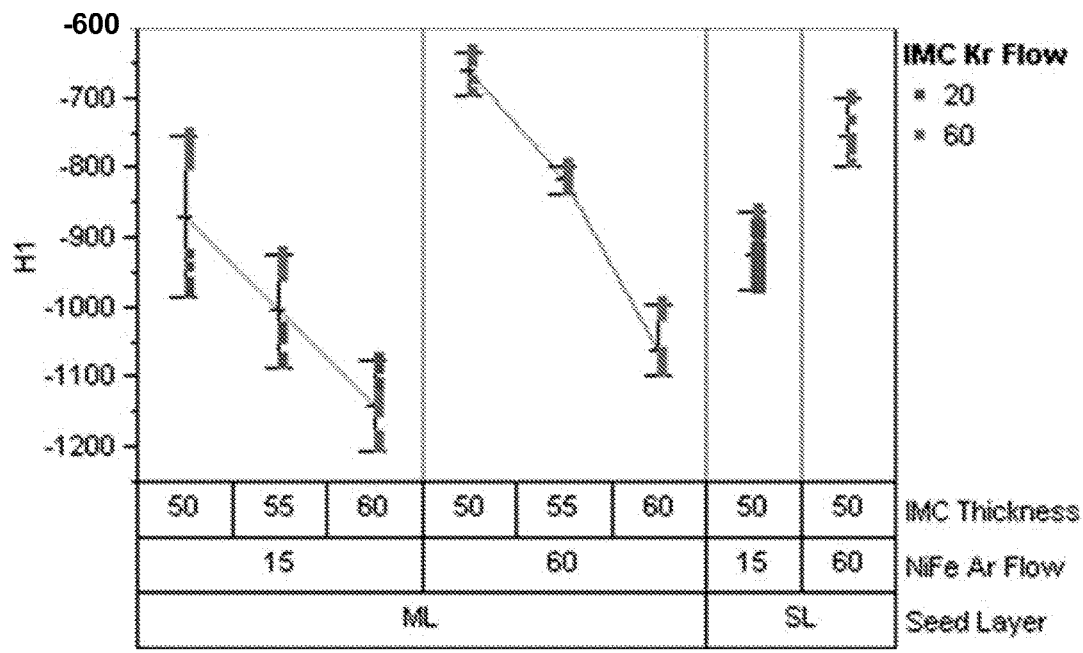
FIGS. 3A and 3B are graphs showing multilayer seed pinning and coercive field for multilayer structures according to example embodiments.
Figure 3B:
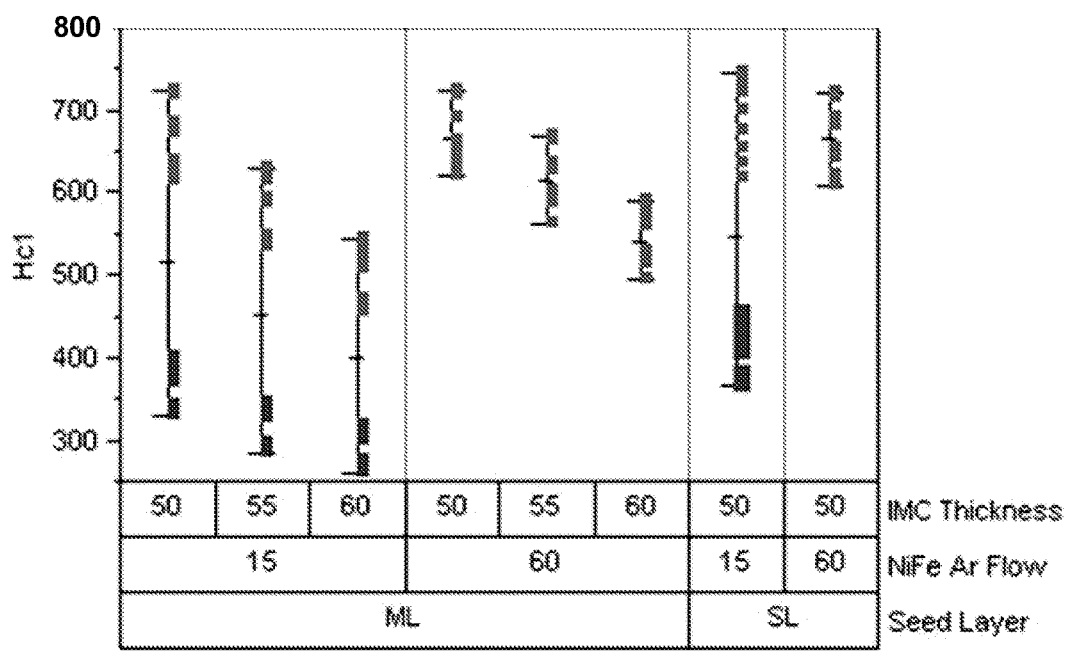

FIGS. 3A and 3B show results of multilayer seed pinning and coercive field for various configurations tested. More particularly, FIGS. 3A and 3B shown pinning and coercivity of AFM/PL by the multilayer seed layer. As can be seen in FIGS. 3A and 3B, by utilizing a multilayer seed layer, good pinning performance is achieved with low coercivity.

Figure 4A:
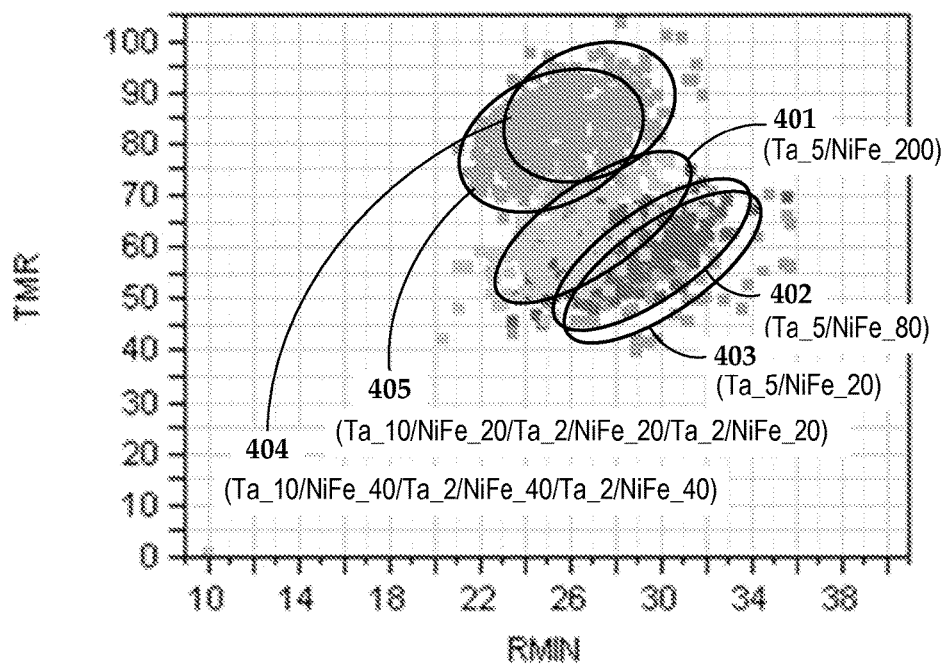
FIG. 4A is a graph showing a wafer level transfer curve for multilayer seed structures according to example embodiments.

FIG. 4A shows a wafer level transfer curve for multilayer seed structures according to example embodiments. The wafer level transfer curve of FIG. 4A shows TMR at equivalent resistance for the multilayer seed layer. The data points 401-403 in FIG. 4A (generally indicated by bounding regions in which the points are clustered) are for three different single layer configurations. The data points 404 and 405 are for two different multilayer configurations.

Figure 4B:
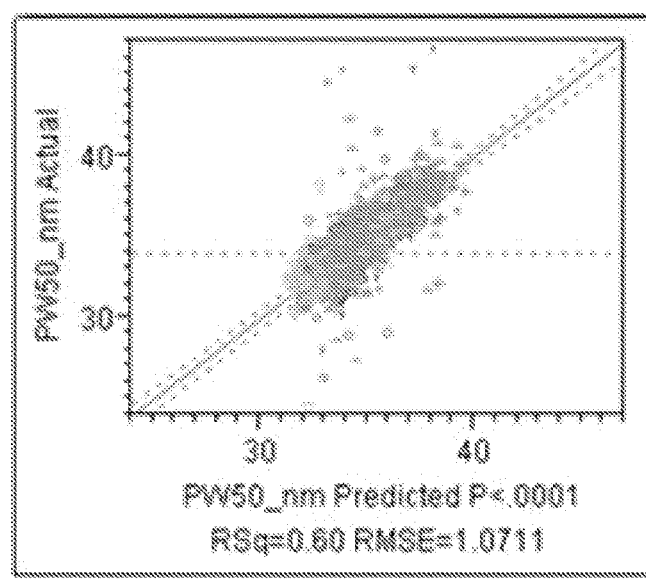
Figure 6:
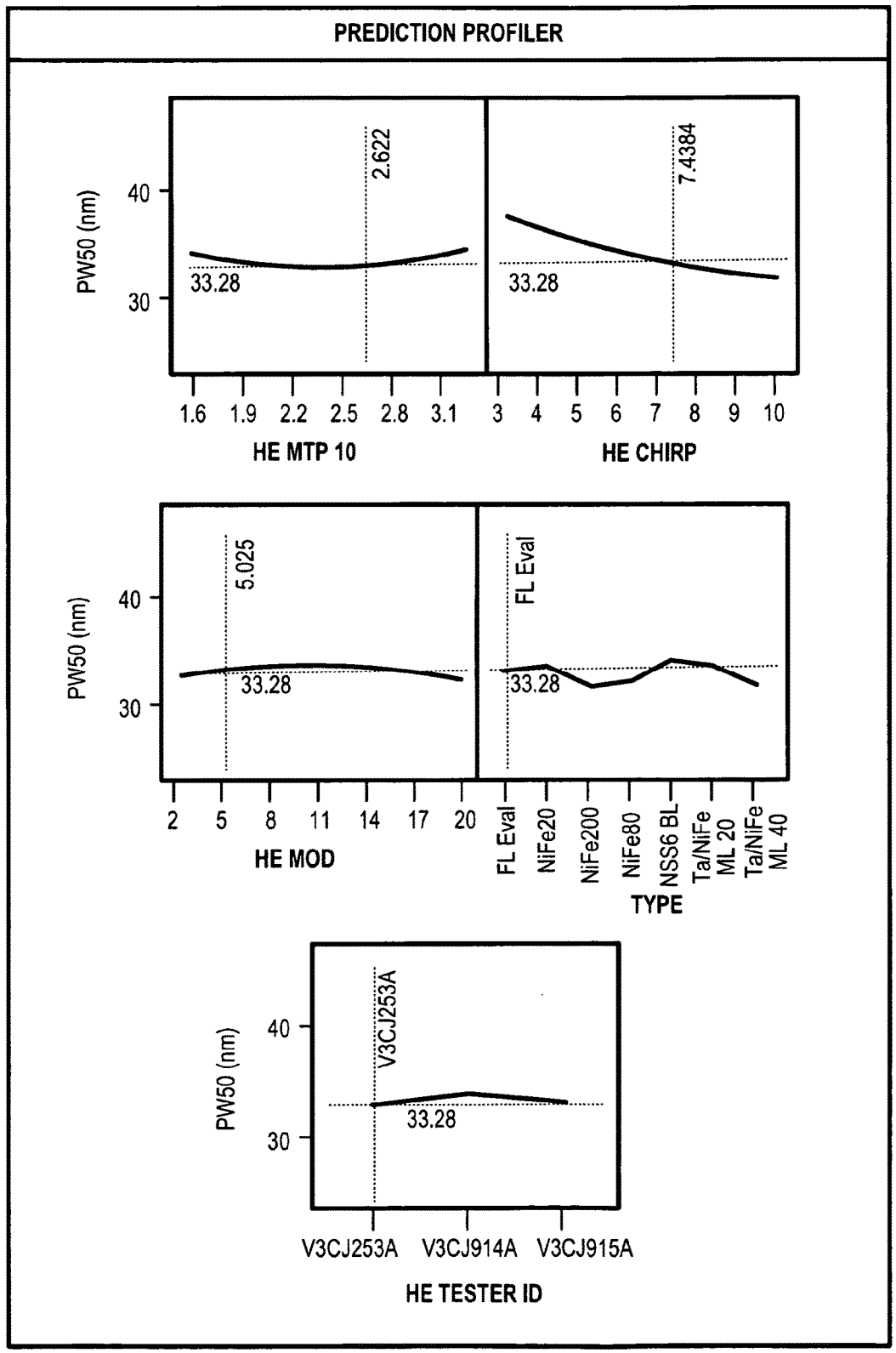
Figure 7A:
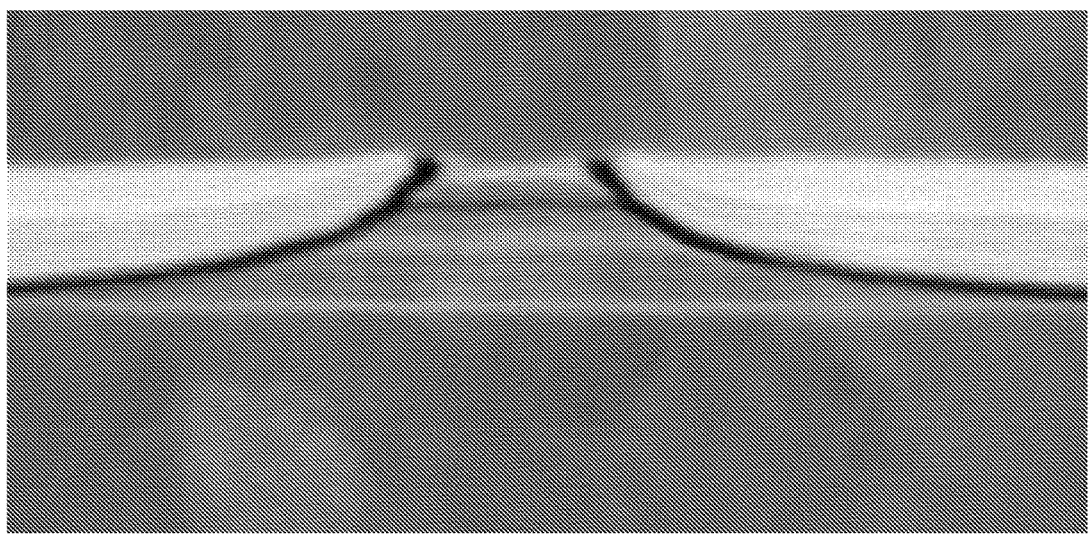
FIG. 7A is a scanning transmission electron microscope image of a CPP tunneling reader according to an example embodiment.
Figure 7B:
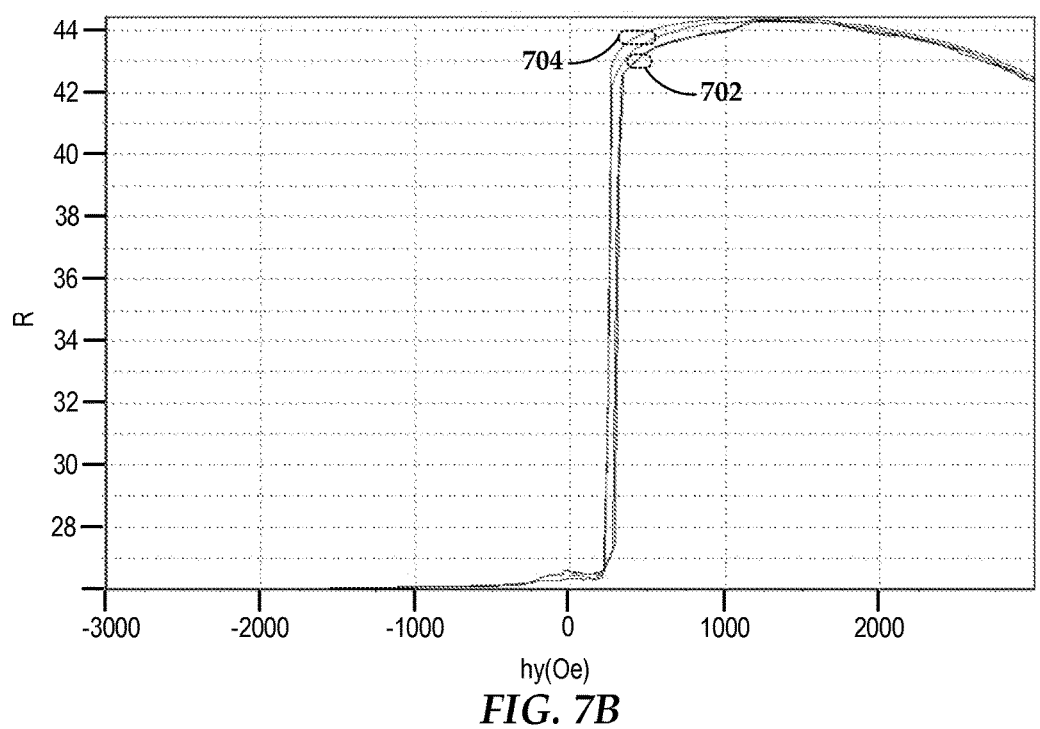
FIG. 7B is a graph of an R vs. H response curve for a multilayer structure according to an example embodiment.

In FIGS. 4B, 5 and 6, a series of graphs illustrate spin stand test results on a multilayer seed layer are shown in comparison to a conventional nonmagnetic seed structure. It can be seen in FIGS. 4B, 5 and 6 that enhanced PW50 is obtained with the multilayer seed due to reduced shield-to-shield spacing. In particular, FIGS. 4B, 5 and 6, both multilayer seed and single layer magnetic seed show acceptable PW50. The multilayer magnetic seed shows >0.2 decade bit error rate (BER) gain over conventional seed reader. FIG. 7A shows a scanning transmission electron microscope (STEM) image of a CPP tunneling reader according to an example embodiment. FIG. 7B shows an R vs. H response curve for a multilayer seed structure of Ta_1/NiFe_4/Ta_0.2/NiFe_4/Ta_0.2/NiFe_4 (nm). Curve 702 is a forward response, and curve 704 is reverse.

According to another representative example, a magnetic seed layer of nonmagnetic/magnetic multilayer with nonmagnetic layer of Ta, TaCr, NiW with W>6 at % and magnetic layer of NiFeW, NiCoW, NiCoFeW, CoFeW or NiW with W<6 at % is used. This enables the seed layer to have a sufficiently high magnetic moment to act as a shield layer as well as a seed layer for the read sensor stack.

In the examples discussed below, a multilayer seed structure Ta_x(NiFe20W3at%_y/Ta_z)n)NiFe20W3at%_y is deposited according to various embodiments, where x, y, and z denote the thickness of each layer in nanometers and n is the number of layer repeats. A preferred thickness for x and z is <0.5 nm, but this thickness can be up to about 1 to 2 nm. The layer thickness y is preferably 2 to 30 nm thick. The number of repeats, n, can be between 0 and 10, for example.

This structure exhibits increased pinning over that of examples where NiFe magnetic layers are used, due to crystalline texture utilizing NiW or NiFeW in the seed layer. In addition, the magnetic moment of NiFeW is sufficiently high to provide for shielding characteristics and thus achieves enhanced reader resolution and PW50.

Figure 8A:
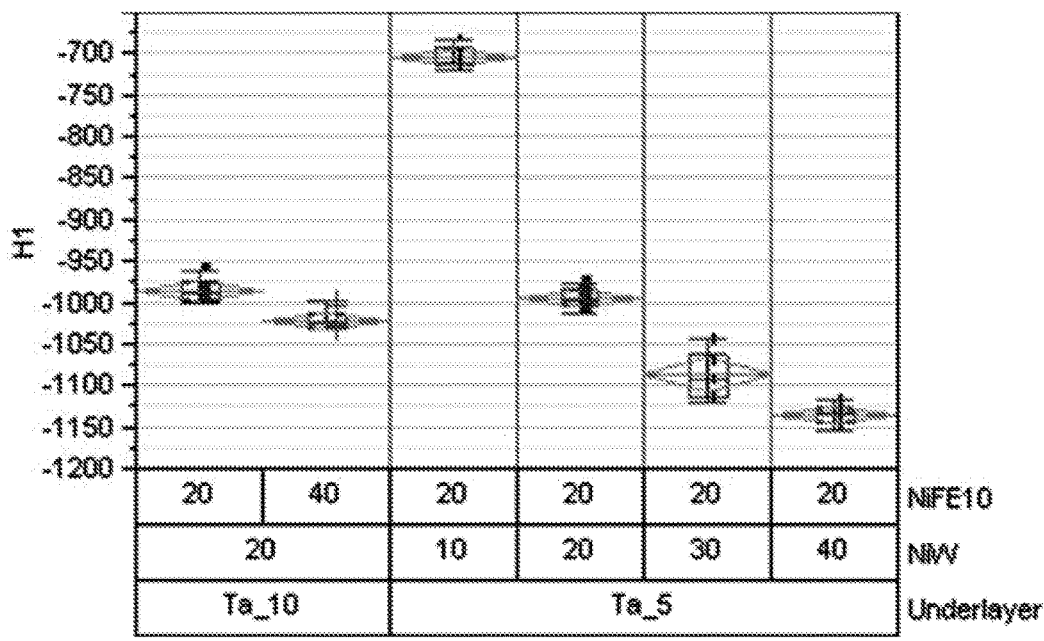
FIGS. 8A and 8B are graphs showing seed pinning field for multilayer structures according to example embodiments.
Figure 8B:
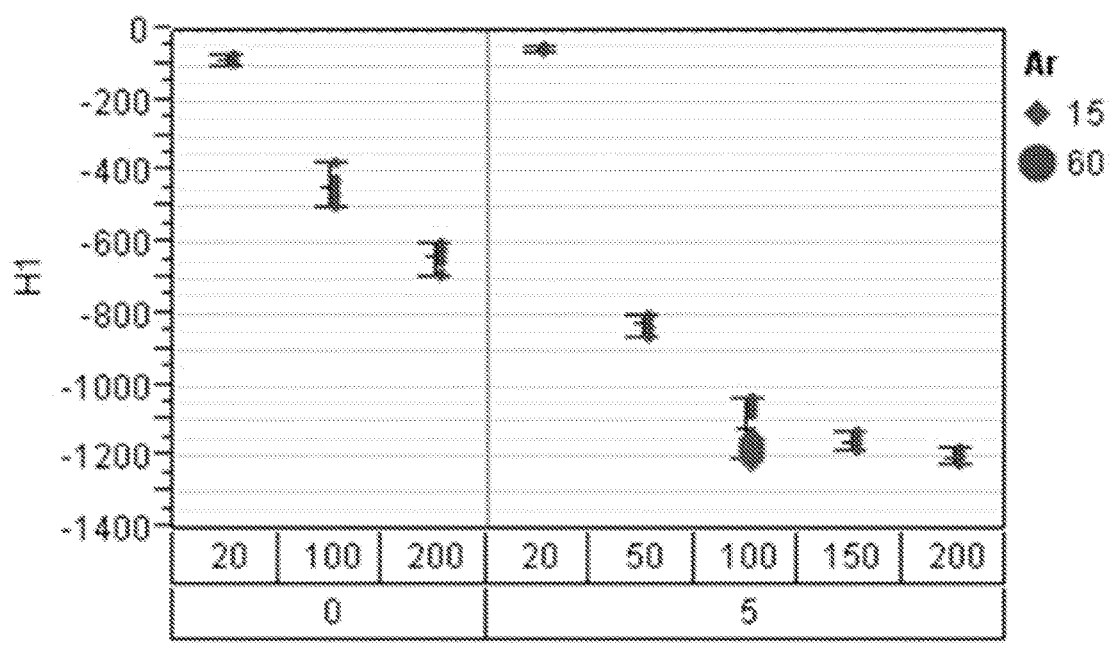

In FIGS. 8A and 8B, graphs show results of the multilayer seed pinning field for various configurations tested. Pinning of AFM/PL utilizing a Ta/NiW seed layer is shown in FIG. 8A, and pinning of AFM/PL utilizing a Ta/NiFeW seed layer is shown in FIG. 8B, with both figures showing that significant pinning is achieved.

Figure 9A:
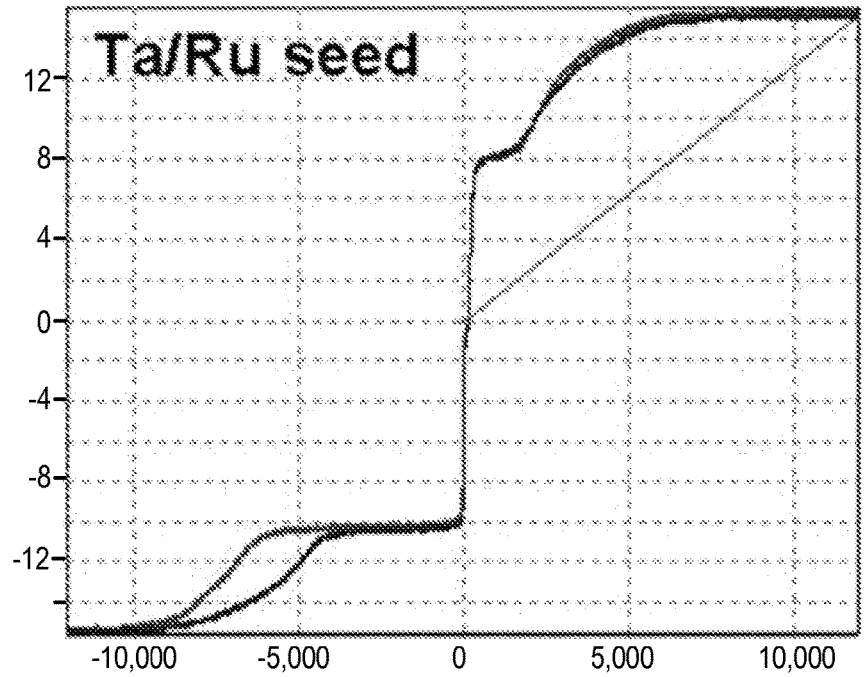
FIGS. 9A and 9B are graphs show magnetic response vs. applied field for multilayer structures according to example embodiments.
Figure 9B:
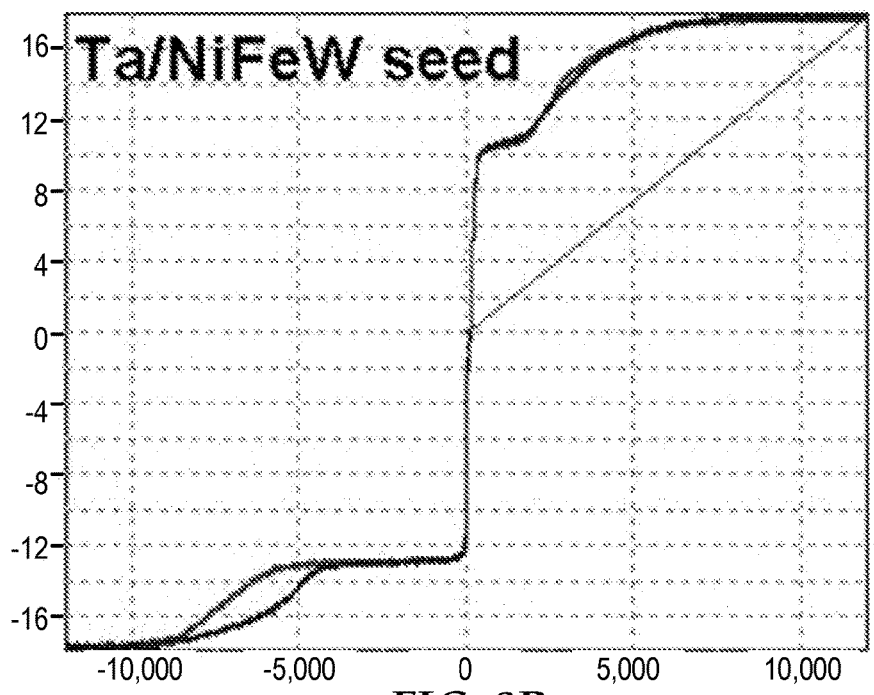

In FIGS. 9A and 9B, graphs show a wafer level magneto-optical Kerr magnetometer (MOKEM) loop of the magnetic response vs. applied field for a Ta/NiFeW seed layer vs. a Ta/Ru seed layer. FIG. 9A shows a wafer level MOKEM loop of a Ta/Ru seeded TMR reader, and FIG. 9B shows a wafer level MOKEM loop of a Ta/NiFeW seeded TMR reader. FIG. 9B clearly shows the enhanced pinning obtained utilizing a Ta/NiFeW seed layer. High reader resolution and a good PW50 are also achieved when using a Ta/NiFeW seed as has been observed with a Ta/NiFe multilayer seed due to decreased shield-to-shield spacing owing to the seed layer acting as shield. The pinning and resolution performance are features of interest in this configuration.

Figure 10:
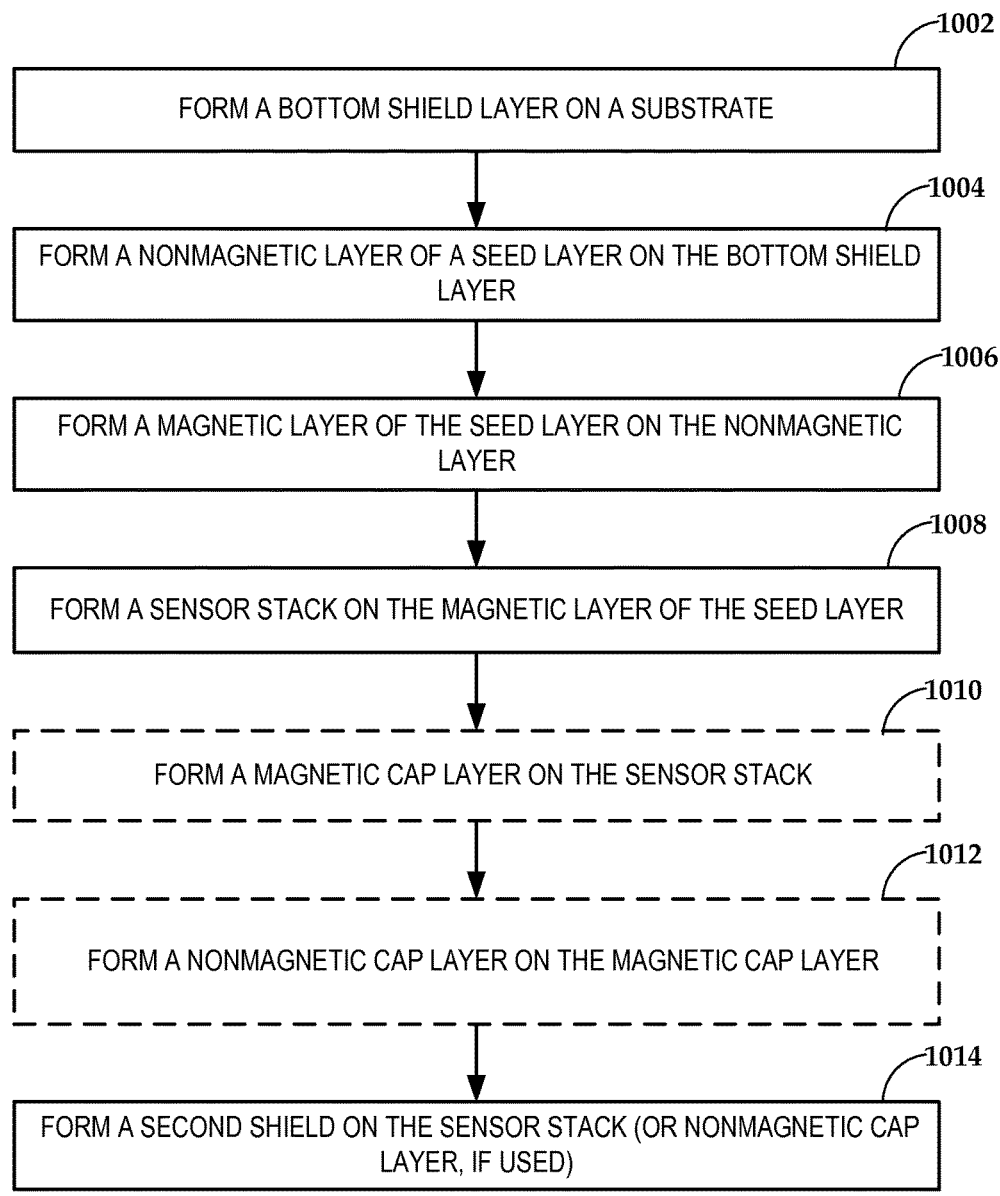
FIG. 10 is a flowchart illustrating a procedure according to an example embodiment.

In reference now to FIG. 10, a flowchart illustrates a procedure according to an example embodiment. The procedure involves forming 1002 a bottom shield layer on a substrate. This need not involve forming the bottom shield on the substrate; intervening materials/layers may be disposed between the bottom shield and substrate. A nonmagnetic layer of a seed layer is formed 1004 on the first bottom shield layer, a magnetic layer of the seed layer is formed 1006 on the nonmagnetic layer, and sensor stack is formed 1008 on the magnetic layer of the seed layer. Optionally, a magnetic cap layer 1010 may be formed on the sensor stack, and a nonmagnetic layer formed 1012 on the magnetic layer. An upper shield is formed 1014 on the sensor stack, which may involve forming the shield on a single-layer or multi-layer cap that is disposed between the sensor stack and upper shield.

Embodiments of various seeding configuration disclosed herein have been shown to provide for further reduction of shield-to-shield spacing without sacrificing reader stability in sub-50 nm reader width (RW) targets that also allow for potential gains in PW50 performance. Various aspects of the disclosed embodiments can be further appreciated when viewed in the context of the disclosure of commonly owned U.S. Published Patent Application No. 2009/0174968, filed Jan. 9, 2008, which is incorporated herein by reference.

The foregoing description of the example embodiments has been presented for the purposes of illustration and description. It is not intended to be exhaustive or to limit the embodiments to the precise form disclosed. Many modifications and variations are possible in light of the above teaching. Any or all features of the disclosed embodiments can be applied individually or in any combination are not meant to be limiting, but purely illustrative. It is intended that the scope of the invention be limited not with this detailed description, but rather determined by the claims appended hereto.

What is claimed is:

1. A magnetic sensor, comprising:
   a bottom shield layer;
   an upper shield layer;
   a sensor stack adjacent the upper shield layer; and
   a seed layer between the bottom shield layer and an antiferromagnetic layer of the sensor stack, wherein the seed layer comprises one or more dual layer structures, each dual layer structure including a magnetic layer comprising a NiW alloy disposed directly on a nonmagnetic layer, the nonmagnetic layer being less than half the thickness of the magnetic layer in the dual layer structure, and wherein a magnetic layer of one of the one or more dual layer structures is adjacent the sensor stack and a nonmagnetic layer of one of the one or more dual layer structures is adjacent the bottom shield layer.

2. The magnetic sensor of claim 1, wherein the magnetic layer comprises a high magnetic moment soft ferromagnetic material.

3. The magnetic sensor of claim 1, wherein the magnetic layer comprises an NiFeW, NiCoW, or NiCoFeW alloy layer.

4. The magnetic sensor of claim 1, wherein the nonmagnetic layer comprises a Ta, Ru, TaCr, or NiW layer.

5. The magnetic sensor of claim 1, further comprising a cap layer between the upper shield layer and the sensor stack, the cap layer comprising a magnetic cap layer adjacent the sensor stack and a nonmagnetic cap layer adjacent the upper shield layer.

6. A method, comprising:
forming a bottom shield layer on a substrate;
forming a first nonmagnetic layer of a seed layer on the bottom shield layer;
forming a first magnetic layer of the seed layer directly on the first nonmagnetic layer, wherein the magnetic layer is more than twice as thick as the nonmagnetic layer;
forming a second nonmagnetic layer of the seed layer on the first magnetic layer of the seed layer;
forming a second magnetic layer of the seed layer directly on the second nonmagnetic layer of the seed layer;
forming a sensor stack on the magnetic layer of the seed layer; and
forming an upper shield on the sensor stack.

7. The method of claim 6, wherein the magnetic layer comprises a high magnetic moment soft ferromagnetic material.

8. The method of claim 6, wherein the magnetic layer comprises at least one of an NiW, NiFe, NiFeW, NiCoW, NiCoFeW , CoNiFe, CoFeB, or NiFeB layer.

9. The method of claim 6, wherein the nonmagnetic layer comprises a Ta, Ru, TaCr, or NiW layer.

10. The method of claim 6, further comprising:
forming a magnetic cap layer on the sensor stack; and
forming a nonmagnetic cap layer on the magnetic cap layer, wherein the upper shield is formed on the nonmagnetic cap layer.

11. A magnetic sensor, comprising:
a magnetoresistive sensor stack disposed between bottom and upper shields; and
at least two adjacent dual layer structures, each dual layer structure including a magnetic layer adjacent a nonmagnetic layer, coupling the magnetoresistive sensor stack to at least one of the bottom and upper shields, one of the dual layer structures having a magnetic layer adjacent the sensor stack and another dual layer structure having a nonmagnetic layer adjacent the respective at least one of the bottom and upper shields, wherein the at least two dual layer structures provide an effective shield-to-shield spacing that is less than a distance between the bottom and upper shields.

12. The magnetic sensor of claim 11, wherein the magnetic layer comprises a high magnetic moment soft ferromagnetic material.

13. The magnetic sensor of claim 11, wherein the nonmagnetic layer is substantially thinner than the magnetic layer.

14. The magnetic sensor of claim 11, wherein the magnetic layer comprises at least one of an NiW, NiFeW, NiCoW, NiCoFeW , CoNiFe, CoFeB, or NiFeB layer.

15. The magnetic sensor of claim 11, wherein the nonmagnetic layer comprises at least one of a Ta, Ru, TaCr, or NiW layer.

\* \* \* \* \*